United States Patent [19]

Zucker et al.

[11] Patent Number: 4,818,947

[45] Date of Patent: Apr. 4, 1989

[54] APPARATUS FOR MEASURING HARMONIC DISTORTION IN A CONDUCTOR, AND METHODS OF CONSTRUCTING AND UTILIZING SAME

[75] Inventors: Myron Zucker, Bloomfield Hills; Ronald G. Jawernycky, Farmington Hills, both of Mich.; Michael Z. Lowenstein, Lakewood, Colo.; Gerald L. Park, East Lansing, Mich.

[73] Assignee: Myron Zucker, Inc., Royal Oak, Mich.

[21] Appl. No.: 169,407

[22] Filed: Mar. 17, 1988

[51] Int. Cl.$^4$ .............................................. G01R 29/26
[52] U.S. Cl. .............................. 324/57 DE; 324/57 N
[58] Field of Search ............... 324/57 DE, 57 N, 520, 324/521; 379/21, 22, 23, 24, 25

[56] References Cited

U.S. PATENT DOCUMENTS

| | | | |
|---|---|---|---|
| 2,782,366 | 4/1953 | Wall | 324/57 DE |
| 2,927,270 | 9/1956 | Wilton | 324/127 |
| 3,299,351 | 3/1964 | Williams | 324/57 DE |
| 3,890,570 | 6/1975 | Kristensen et al. | 324/77 R |
| 3,916,296 | 10/1975 | Narimatsu et al. | 323/64 |
| 3,927,281 | 12/1975 | Bradley | 324/57 DE |
| 3,932,741 | 1/1976 | Hanson | 235/197 |
| 3,978,401 | 8/1976 | Lum | 324/57 N |
| 4,323,738 | 4/1982 | Merrick | 379/21 |
| 4,340,854 | 7/1982 | Jones et al. | 324/57 DE |
| 4,413,234 | 11/1983 | Lypoli | 324/435 |
| 4,496,900 | 1/1985 | Di Stefano et al. | 324/71.1 |

Primary Examiner—Reinhard J. Eisenzopf
Assistant Examiner—Maura K. Regan
Attorney, Agent, or Firm—Irving M. Weiner; Joseph P. Carrier; Robert M. Petrik

[57] ABSTRACT

A portable instrument for locating and measuring harmonic distortion in a conductor. The instrument permits harmonics to be easily read while the load is changing. Thus, the instrument may provide a great deal of insight as to the source of problem causing harmonics.

13 Claims, 2 Drawing Sheets

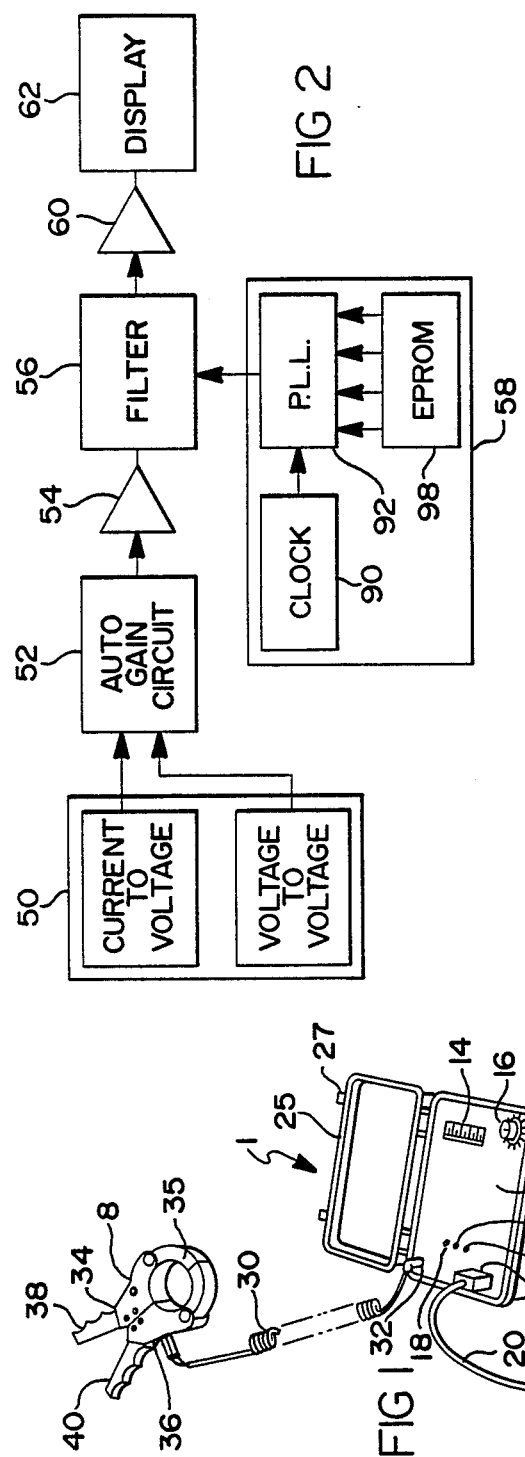
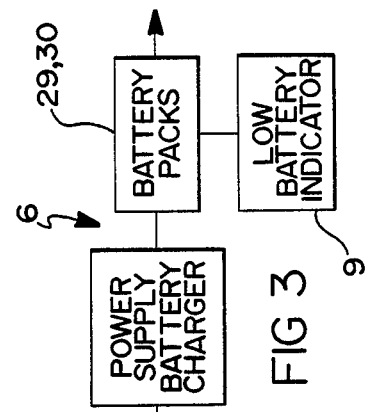
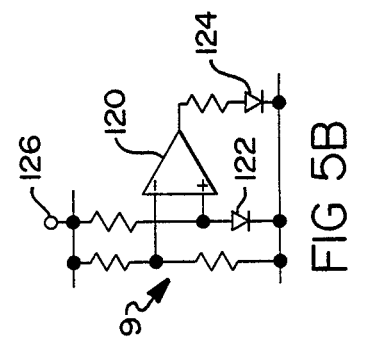
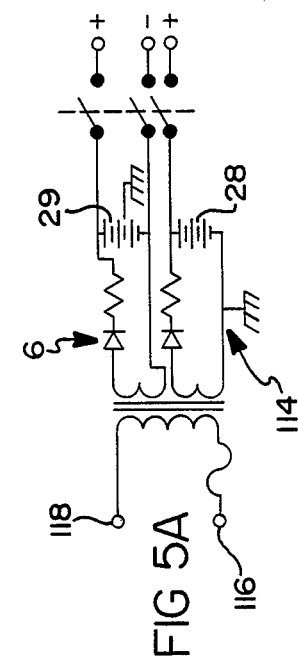

APPARATUS FOR MEASURING HARMONIC DISTORTION IN A CONDUCTOR, AND METHODS OF CONSTRUCTING AND UTILIZING SAME

BACKGROUND OF THE INVENTION

1. Field of the Invention

The present invention pertains to apparatus for measuring and indicating harmonic distortions in conductors, such as power lines. More particularly, the present invention pertains to a portable, simple-to-use, and highly versatile instrument for quickly measuring and indicating a range of individual harmonic distortions in conductors.

2. Description of the Relevant Art

There are known devices for detecting and/or displaying harmonic distortion in conductors. Such known devices are for example, disclosed in U.S. Pat. No. 2,782,366, 3,916,296, and 3,927,281.

U.S. Pat. No. 2,782,366 discloses "oscillographic apparatus for analyzing the performance of amplifiers, modulators, detectors and the like." The disclosed apparatus comprises a circuit including a test oscillator, a group of potentiometers, amplifiers tuned to first, second and any other desired harmonic, a battery, and a group of oscilloscopes for providing output displays. This known apparatus has many disadvantages. For example, it is very bulky and difficult to use, especially in remote locations. Also, this apparatus can only be used in testing individual parts which have been disconnected/isolated from their normal use, and harmonic distortion in voltage signals.

U.S. Pat. No. 3,916,296 discloses a high sensitivity/high resolution distortion analyzer including a parallel-T circuit bridge that is tuned by adjusting two variable elements, typically a resistor in one branch of the circuit and a capacitor in a second branch of the circuit. The turning is achieved by separate feed-back circuits that utilize a +45° or a −45° phase-shifted signal derived from an input voltage signal. This apparatus is substantially easier to use than that disclosed in U.S. Pat. No. 2,782,366, but still has several problems and disadvantages associated therewith. For example, the apparatus is still quite inconvenient to use (especially in remote locations) because the operator is required to turn off the power to an electrical component before connecting the analyzer thereto (resulting in expensive down time), and because the operator is required to adjust the variable elements. Also, the disclosed analyzer, like that disclosed in patent U.S. Pat. No. 2,782,366, is limited to analyzing the harmonic distortions of a voltage signal, and does not include any means for selectively choosing various single harmonics to be measured.

U.S. Pat. No. 3,927,281 discloses an instrument for measuring harmonic distortion in telephone transmission lines. The instrument measures the harmonic distortion introduced during telephone line transmission, and can distinguish between the harmonic distortion introduced at the send terminal and that introduced in the receiver terminal. The disclosed instrument comprises a frequency phase lock circuit which generates "disturbance-free", in-phase and quadrature voltage signals of a received test tone, the disturbance-free generated tones being different from the transmitted test tone as a result of possible frequency shift along the transmission channel and phase shifts in the terminal equipment at both ends. As disclosed the instrument is connected to an oscilloscope 50 for providing an output display. This instrument has associated therewith substantially the same problems and disadvantages as discussed above with regard to the analyzer disclosed in U.S. Pat. No. 3,916,296.

Conventional distortion analyzers, including those discussed above, have many problems and disadvantages associated therewith, and have as a whole failed to fulfill a need in the art for a portable, simple-to-use and highly versatile instrument which can be used for quickly and easily locating and measuring problem-causing harmonic distortion in substantially any conductor while the conductor is in normal operation.

SUMMARY OF THE INVENTION

The present invention has been designed to overcome the many problems and disadvantages of known harmonic distortion analyzers, and to satisfy a great need in the art, as discussed above.

According to the present invention, there is provided an apparatus for locating and measuring harmonic distortion in a conductor, the apparatus comprising a first means detachably connectable to a conductor for providing an input signal indicative of electrical energy in the conductor, a second means connected to the first means and receiving the input signal therefrom, the second means providing a modified signal indicative of the strength of a single, predetermined harmonic of the input signal, and third means connected to the second means for selectively varying the single, predetermined harmonic which is indicated by the modified signal.

Additionally, the apparatus according to the present invention may further comprise a fourth means connected to the third means and receiving the modified signal therefrom, the fourth means providing a display of the modified signal, and a fifth means interconnected between the first and second means for automatically controlling a gain of the input signal so that the input signal remains essentially constant despite variations of the electrical energy in the conductor.

It is an object of the present invention to provide a portable, simple-to-use and highly versatile instrument for measuring a range of individual harmonic distortions in electrical conductors, and for readily locating sources of such harmonic distortions.

Another object of the present invention is the provision of such an instrument which can be readily attached to conductors, such as power lines, while electrical energy is continuously present therein, or in other words, without circuit interruptions.

A further object of the present invention is the provision of such an instrument capable of producing accurate harmonic measurements and indications over very large voltage and current ranges.

Still another object of the present invention is the provision of a fast acting auto-gain circuit acting on an input signal from the first means to thereby eliminate the need for manually zeroing the instrument as circuit loads vary, and so that harmonics can be easily and accurately read while the amount of electrical energy in the conductor is changing.

Yet another object of the present invention is the provision of such an instrument which is very compactly and efficiently arranged in an impact-resistant, water-resistant case such that an operator can easily carry and manipulate the instrument with a single hand.

Other objects, advantages and salient features of the present invention will become apparent from the following detailed description, which, when taken into conjunction with the annexed drawings, discloses a preferred embodiment of the present invention.

BRIEF DESCRIPTION OF THE DRAWINGS

FIG. 1 is a perspective view of a portable instrument according to the present invention.

FIG. 2 is a block diagram of a main circuit of the instrument shown in FIG. 1.

FIG. 3 is a block diagram of an internal, rechargeable power supply of the instrument shown in FIG. 1.

FIG. 5a is a schematic diagram of the power supply circuit, and FIG. 5b is a schematic diagram of a low battery indicator circuit for the power supply.

DETAILED DESCRIPTION OF THE PREFERRED EMBODIMENT

Figure 4:
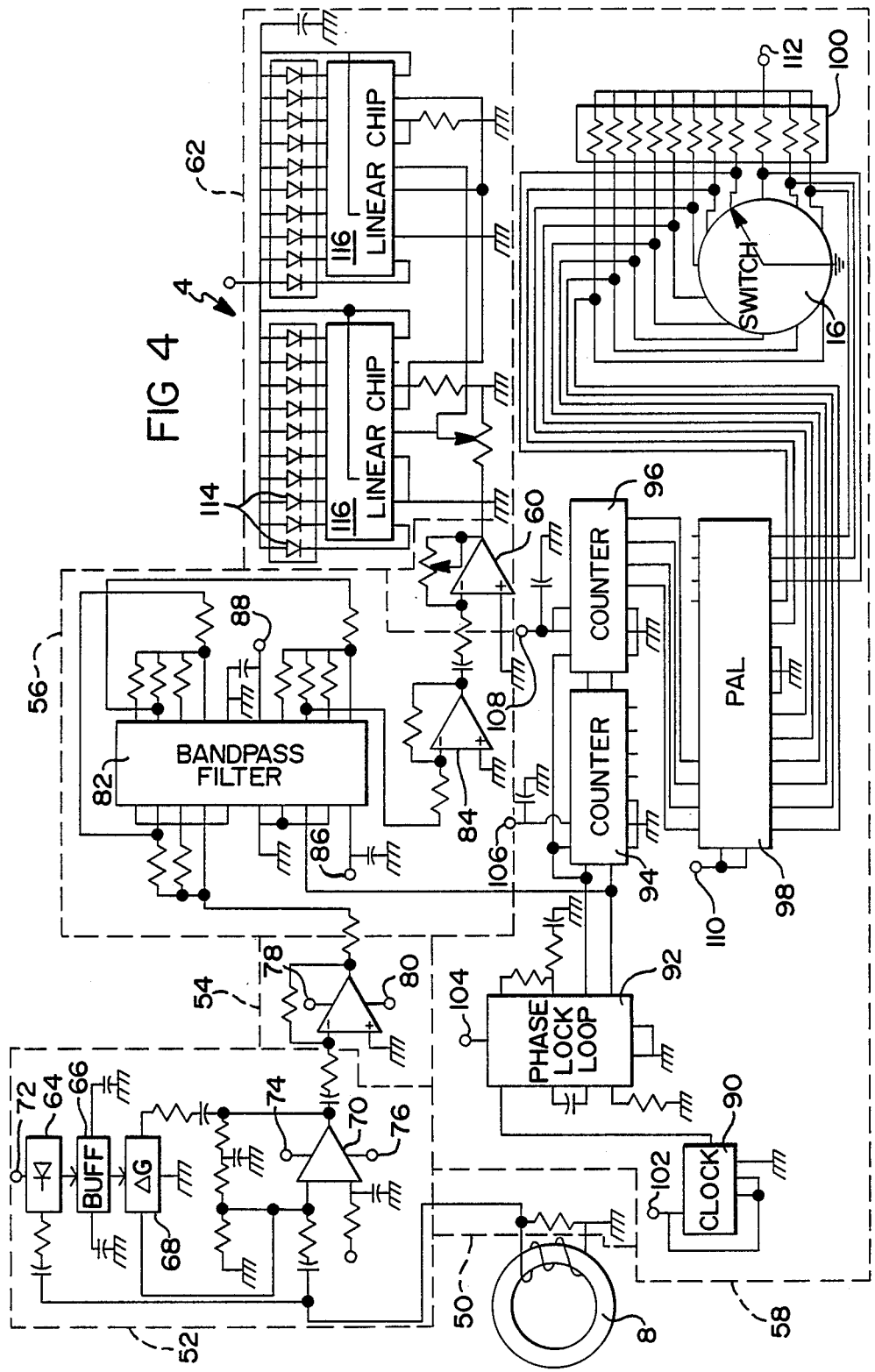
FIG. 4 is a schematic diagram of the main circuit for the instrument.

Referring to FIG. 1, there is shown a portable instrument according to the preferred embodiment of the invention, which is generally indicated by reference numeral 1. The instrument includes a carrying case 2 which internally houses the main circuit 4 shown in FIG. 4, the power supply circuit 6 shown in FIG. 5a and the low battery indicator circuit 9 shown in FIG. 5b; a clamp on current transformer 8 which is selectively connectable to the main circuit 4 through a signal input jack 32; a power on/off switch 10 and a corresponding power on indicator light 12; a display scale 14 for indicating the level of harmonic distortion; a selector switch 16 which permits an operator to select a particular harmonic which is to be shown on the display scale 14; a low battery indicator light 18; a battery charging cord 20 and a corresponding power input jack 22.

The case 2 is preferably constructed from a moldable, impact-resistant, water-resistant plastic, and has the circuits 4, 6, 9 permanently mounted in a base portion 24 thereof below a face plate 26. The power supply circuit 6 preferably includes the pair of rechargeable battery packs 28, 29 (See FIG. 5a), which battery packs would be recharged when necessary using the removable charging cord 20. However, circuit 6 could have any other appropriate/desired construction. For example, the circuit 6 could include a single battery pack and a voltage inverter.

The current transformer 8 is selectively connectable to the main circuit 4 through a signal cord 30 which plugs into the signal input jack 32 on the face plate 26. The depicted, preferred current transformer 8 is a conventional, readily available component constructed as two halves 34, 36, each including a portion of the transformer core 35 at one end thereof. The halves 34, 36 are pivotally connected together such that the portions of the transformer core 35 can be opened by manually squeezing together a pair of handles 38, 40 at opposite end of the halves 34, 36 thereof. The current transformer 8 also includes a biasing means (not shown) for normally holding the core end of the transformer in a closed position. Then, the current transformer 8 can be easily attached to/around substantially any conductor by simply squeezing the handles 38, 40 together, positioning the opened end of the current transformer next to the conductor, and releasing the handles so that the opened end of the transformer clamps around the conductor. Thus, the current transformer can be clamped around the conductor without interrupting the circuit, thereby enabling measurements during plant operation.

The current transformer 8 preferably has a frequency response to at least 5 kilohertz so that higher harmonics are not attenuated and so that the transformer provides an accurate input signal over a large measurement range. Also, the transformer is preferably insulated to permit measurements in bus bar systems energized up to very high voltages, such as up to 600 volts AC.

The harmonic selector switch 16 permits an operator to choose the particular harmonic which is to be measured by the instrument. The selector switch is preferably constructed as a rotatable dial which locks into a plurality of positions corresponding to the various harmonics. For example, is an preferred construction of the invention, the selector switch 16 could be rotated to eleven different positions corresponding to current or voltage amplitude for the fundamental, 2nd harmonic, and odd harmonics 3rd through 19th. These harmonics are the most likely to cause problems in electrical power systems.

The display scale 14 provides output readings for the instrument, which readings show the current amplitude of the selected harmonic as a percentage of the fundamental current amplitude. As shown, the display scale 14 is preferably constructed as a multi-step light bar and a corresponding printed scale reading 0% to 100%.

Optionally, the instrument 1 may also include a recording device (not shown), such as a paper chart and a marking tool, which could record the output readings over a period of time.

When the instrument 1 is not being used, or is being transported, the signal cord 30 and the charging cord 20 are disconnected from their associated jacks 22, 32 and a lid 25 of the case 2 is secured over the base 24 by latches 27. Also, a padded carrying case (not shown) may be used for conveniently carrying the case 2, the current transformer 8, the signal cord 30 and the charging cord 20 during transportation or periods of non-use.

Referring to FIGS. 2 and 4 there is respectively shown a block diagram and a schematic diagram of the main circuit 4 of the instrument 1. The main circuit 4 comprises an input signal conditioner 50 which receives an input signal from the current transformer 8, autogain circuit 52 which receives a conditioned input signal from the conditioner 50, a buffer 54, a filter 56 which filters the input signal and provides a modified signal indicative of the strength of a single predetermined harmonic of the input signal (corresponding to the harmonic chosen using the selector switch 16) relative to the strength of a fundamental harmonic of the input signal, a programmable clock or frequency synthesizer 58 which includes the harmonic selector switch 16 and is connected to the filter 56 for permitting the operator to selectively vary the single, predetermined harmonic which is indicated by the modified signal, an amplifier 60, and a display circuit 62.

According to the preferred embodiment of the present invention the instrument 1 is used to measure a current input signal from the current transformer 8. However, it is within the scope of the present invention that the instrument 1 could alternately be used to measure the harmonic distortions of a voltage input signal by connecting the main circuit 4 between the conductor and ground. For such use, it would normally be necessary to provide a stepdown transformer between the conductor and the main circuit 4 to assure a sufficiently low voltage input signal. Also, because voltage harmonics normally constitute a significantly smaller percentage of the fundamental than corresponding current harmonics, it would be desirable to modify the display circuit 62 and display scale 14 so as to provide output readings over a smaller percentage range of the fundamental, such as 0% through 10%. The input signal conditioner 50 shown in FIG. 2 is indicated as having both a current to voltage portion and a voltage to voltage portion corresponding to a current input signal and a voltage input signal, respectively.

The auto-gain circuit 52 is constructed of fast acting, state of the art electronic components which are initially factory calibrated, thereby eliminating any need for manually zeroing the meter before each use, or as the amount of electrical energy in the conductor varies. This feature of the present invention desirably permits harmonics to be easily read while the load is changing. Thus, data can be taken to show the dependence of a single harmonic or several harmonics upon changing load conditions, and such data can provide a great deal of insight as to the source of problem-causing harmonics.

The preferred embodiment of the auto-gain circuit 52 comprises a voltage to current converter or (rectifier) 64, a buffer 66, a current control, variable gain amplifier (or cell) 68 and an operational amplifier (op amp) 70. Note, there are available compandor chips, such as NE 571 which combines elements 64–70 and NE 572 which combines elements 64–68, that could be used in the present invention. The automatic gain circuit 52 receives an input signal from the signal conditioner 50 and controls the gain of the input signal to provide a substantially constant output signal to the buffer 54. Rectifier 64 and op amp 70 receive power input from the battery 28 at terminals 72, 74, respectively, while op amp 70 is also connected to battery 29 at terminal 76. Buffer 54 is connected to battery 29 at terminals 78, 80.

Filter 56 preferably, comprises a multiple-order programmable, switched capacitor filter 82, such as LTC 1061 CN, and an amplifier 84. The filter 82 would preferably be programmed as a band pass filter using known software, and would be connected to battery 29 at terminals 86, 88. However, the filter 56 could comprise any other desired or appropriate means. For example, the filter 56 could be constructed as an active filter using op amps.

The frequency synthesizer or programmable clock 58 could, for example, comprise a source clock 90, a phase lock loop 92, a pair of divide by n CMOS counters 94, 96, a programmable logic array (PAL) 98, the harmonic selector switch 16, and a pull-up resistor network 100 associated with the switch 16. The source clock 90 is preferably a one kilohertz source clock, such as a PXO-1000 programmed as a one kilohertz source clock, while a 4046 chip could be used as the phase lock loop 92, 4522 chips could be used as the counter dividers 94, 96, and an EPROM chip, such as TMS 2516, could be used as the PAL 98. Of course, any other desired source clock 90 could be used, in which case a different, appropriate PAL 98 might also have to be substituted for the TMS 2516. Components 90, 92, 94, 96, 98 and 100 are each connected to the battery 29 at terminals 102, 104, 106, 108, 110, and 112, respectively. The filter 56 is connected to the frequency synthesizer 58 through the output of the phase lock loop 92.

As shown, the preferred display circuit 62 could, for example, include a plurality of LEDs 114 corresponding to the number of steps in the display scale 14 and at least one linear programmable chip 116, such as LM 3914, which has been appropriately programmed in a known manner. However, it will be understood that the display circuit 62 and the display scale 14 could be alternatively constructed as any other desired display means, such as an analog type dial meter. Also, the display scale 14 could include multiple light bars corresponding to the number of harmonics measured, and the main circuit 4 (including the display circuit 62) could be modified to provide a simultaneous display of each of the measured harmonics as a percentage of the fundamental.

Referring to FIGS. 5a and 5b there is shown a power supply circuit 6 and a low battery indicator circuit 8 according to the present invention. The power supply circuit 6 preferably includes the pair of rechargeable battery packs 28, 29, as discussed above, as well as a recharger circuit 114 for the battery packs. The battery packs 28, 29 preferably have different voltage outputs. For example, battery pack 28 could have a +12 volt DC output, while battery pack 29 could have a +5 V and a −5 volt DC output. The battery recharger circuit 114 has input terminals 116, 118 which would be connectable to an appropriate power source, such as 120 volts AC, through the recharger cord 20 when necessary.

The low battery indicator circuit 8 includes an amplifier 120 and a pair of LEDs 122, 124. LED 122 functions as a voltage reference, while LED 124 lights to indicate low battery at indicator 18. As indicated, the low battery indicator circuit 8 is preferably connected to battery pack 28 at terminal 126.

As discussed above, the main circuit 4 of the harmonic distortion measuring instrument 1 permits the instrument to be used for measurements on systems having a wide range of voltages (for example, up to 600 volts), and will provide accurate harmonic readings over a very wide range of line currents (for example, over a range of 10–1000 amps). The depicted main circuit to 4 could also be used to measure line currents in the range of 0–10 amps, but such measurements would not be as accurate as measurements in the range of 10–1000 amps. It will be understood, however, that the depicted main circuit 4 is merely a preferred embodiment, and that the circuit 4 could be modified for accurate use in any voltage range and any current range.

Operation of the instrument 1 is as follows.

Initially, an operator would connect the current transformer 8 to the main circuit 4 by plugging it in to the input jack 32, and would then clamp the current transformer 8 around a desired conductor, such as a power line. The current transformer must be connected to the input jack 32 before it is clamped around the conductor, or a high voltage will be developed on the transformer leads and this can present a severe shock hazard.

For making the actual measurements, all that an operator is required to do is turn on the instrument 1 using the on/off switch 10, and then turn the harmonic selector switch 16 to the desired harmonic. Normally, the selector switch will initially be turned to the fundamental harmonic, whereby the display scale 14 should read 100% if there is sufficient current in the conductor being measured. The operator then would turn the selector switch to each other desired harmonic and could record the harmonic amplitude measurements indicated by the display scale 14. Subsequently, the operator would interpret the recorded data to determine the sources of problems that have been encountered with particular conductors.

An exemplary data record sheet, including exemplary data, is shown in Table 1.

In reference to Table 1, the auto-gain feature of the instrument 1 was used to determine/record the amplitude of harmonic distortion in the conductor while a suspect harmonic source, such as an SCR drive, was turned on and off. In this manner, the auto-gain feature is particularly useful in locating equipment that is causing (is the source of) harmonic distortion. From the data in Table 1, the operator would be able to trace motor overheating and excessive bearing wear to the fifth harmonic component in the motor current when the SCR drive is operated at high power. The harmonic current causes the motor rotor to "cog" and has the effect of hammering on the bearings. The extra current also increases the operating temperature of the motor.

Also, the operator would note the concentration of harmonic current in the capacitor. Since capacitor impedance decreases with frequency, the presence of harmonics causes a large increase in capacitor current, resulting in heat dissipation. When the SCR drive is at idle, the decrease is manageable, but with the drive operating a high power, the capacitor current is near the limit for both the capacitor and the fuse. This could explain a capacitor fuse blowing which was observed. With the SCR drive at high power, enough harmonic distortion exists in the line to affect computer circuits.

On the basis of the data shown in Table 1, the operator would be able to recommend a desired course of action. In this case, a course of action would be recommended which would improve the overall power factor and reduce the harmonic interference. For example, a tuned fifth harmonic filter or trap, sized to improve the power factor to the desired value, could be connected to the line at the SCR drive. This should reduce the harmonic currents at the small capacitors. If the problems with high capacitor currents continue, as determined by a recheck with the instrument 1, replacing these capacitors with a trap is another possibility.

Harmonic distortion measurements obtained using the instrument 1 could obviously be used for many other purposes. For example, detection of the second harmonic of electrical energy in a conductor can be used to indicate DC current components. Also, the harmonic levels in each leg of a three-phase system could be measured separately to determine if the phases are equally loaded.

Although there has been described what is at present considered to be the preferred embodiment of the present invention, it will be understood that the invention can be embodied in other specific forms without departing from the spirit or essential characteristics thereof. For example, the modified signal which is being provided to the display circuit 62 could also (or alternatively) be provided to a computerized energy management system which would automatically control the power in the conductor to be within a desired range. Similarly, the modified signal could also be provided to an appropriate alarm means, such as an audio alarm, a visual alarm, etc., which would be activated (for example) whenever a measured harmonic exceeded a predetermined maximum, percentage of the fundamental.

The described embodiment is, therefore, to be considered in all aspects as illustrative, and not restrictive. The scope of the invention is indicated by the appended claims rather than the foregoing description.

TABLE 1

PLANT XYZ Inc.     DATE today     PAGE 1     OF 1
LOCATION Big City, USA
GENERAL DESCRIPTION of plant, problem, etc. Since installation of
    SCR adjustable speed drives on blower motors, computers have been
        malfunctioning. Capacitor fuses are blowing and other motors
            throughout the plant are overheating. Motor bearings are showing
                abnormal wear.

SYSTEM NAMEPLATE VOLTAGE volts     480       RATED LOAD kva   1500
POWER FACTOR from utility bill                75%  LOAD CURRENT amps  NA
POWER FACTOR measured _____       MEASURING INSTRUMENT _____
MEASURING POINT (diagram or description) _____
                                30 hp pump motor with 7.5 KVAR
                                power factor correction capacitor.
                                A 100 KVA adjustable speed drive
                                has been added to the line and
                                its effect is to be measured.

OVER

| TEST NUMBER→ | 1a | 1b | 1c | 2a | 2b | 2c |
|---|---|---|---|---|---|---|
| MEASURING POINT→ | A | B | C | A | B | C |
| EQUIPMENT | | | | | | |
| other equipment | + | + | + | + | + | + |
| 30 hp pump motor | + | + | + | + | + | + |
| variable drive | + | + | + | − | − | − |
| POWER LEVEL→ | 70% | 70% | 70% | 0 | 0 | 0 |
| CURRENT amps→ | 26 | 24 | 32 | 22 | 23 | 9 |
| VOLTAGE volts→ | 465 | 465 | 465 | 470 | 470 | 470 |
| HARMONIC | | | | | | |
| 2→ | 0 | 0 | 0 | 0 | 0 | 0 |

TABLE 1-continued

| HARMONIC % | | | | | | | |
|---|---|---|---|---|---|---|---|
| | 3→ | 5 | 0 | 10 | 0 | 0 | 0 |
| | 5→ | 30 | 20 | 85 | 10 | 0 | 25 |
| | 7→ | 5 | 0 | 20 | 5 | 0 | 10 |
| | 9→ | 5 | 0 | 10 | 0 | 0 | 0 |
| | 11→ | 10 | 5 | 25 | 0 | 0 | 0 |
| | 13→ | 0 | 0 | 0 | 0 | 0 | 0 |
| | 15→ | 5 | 0 | 10 | 0 | 0 | 0 |
| | 17→ | 5 | 0 | 10 | 0 | 0 | 0 |
| | 19→ | 0 | 0 | 0 | 0 | 0 | 0 |
| PHOTO CODE→ | | | | C-70% | | | C-0% |
| MEASUREMENTS TAKEN BY | M. Z. L., R. J. | | COMPANY | Myron Zucker, Inc. | | | |

We claim:

1. Apparatus for locating and measuring harmonic distortion in a conductor, comprising: first means detachably connectable to a conductor for providing an input signal indicative of electrical energy in said conductor; second means connected to said first means and receiving said input signal therefrom, said second means providing a modified signal indicative of the strength of a single, predetermined harmonic of said input signal; and
   third means connected to said second means for selectively varying the single, predetermined harmonic which is indicated by said modified signal.

2. Apparatus according to claim 1, wherein: said apparatus further comprises a fourth means connected to said third means and receiving said modified signal therefrom, said fourth means providing a display of said modified signal.

3. Apparatus according to claim 2, wherein: said apparatus further comprises a fifth means interconnected between said first and second means for automatically controlling a gain of said input signal so that the said apparatus does not have to be recalibrated prior to each use, and so that input signal remains essentially constant despite variations of the electrical energy in said conductor.

4. Apparatus according to claim 3, wherein: said apparatus further comprises a sixth means connected to each of said first, second, third, fourth and fifth means for supplying power thereto.

5. Apparatus according to claim 1, wherein: said first means comprises a current transformer adapted to be selectively clamped around said conductor.

6. Apparatus according to claim 1, wherein: said second means comprises a filter; and the modified signal indicates the strength of the single, predetermined harmonic relative to the strength of a fundamental harmonic of said input signal.

7. Apparatus according to claim 1, wherein: said second means comprises a multiple-order programmable, switch-capacitor, band pass filter; and the modified signal indicates the strength of the single, predetermined harmonic relative to the strength of a fundamental harmonic of said input signal.

8. Apparatus according to claim 1, wherein: said third means comprises a frequency synthesizer.

9. Apparatus according to claim 8, wherein: said frequency synthesizer includes a harmonic selector switch adapted to be manually set by an operator to different harmonics, a source clock, and a phase lock loop connected between the source clock and the harmonic selector switch.

10. Apparatus according to claim 9, wherein: said frequency synthesizer further comprises a programmable logic array connected between said selector switch and said phase lock loop.

11. Apparatus according to claim 2, wherein: said fourth means comprises a multi-step light bar and a plurality of LEDs associated with the light bar.

12. Apparatus according to claim 4, wherein: said sixth means comprises a rechargeable battery, a recharger circuit connected to the battery, said recharger circuit being selectively connectable to an external power source, and an indicator circuit connected to the battery for indicating when said battery is running low on power.

13. Apparatus according to claim 12, wherein: said indicator circuit comprises a first LED functioning as a voltage reference, and the second LED which lights to indicate low battery power.

* * * * *

UNITED STATES PATENT AND TRADEMARK OFFICE
CERTIFICATE OF CORRECTION

PATENT NO. : 4,818,947

DATED : April 4, 1989

INVENTOR(S) : Myron Zucker et al.

It is certified that error appears in the above-identified patent and that said Letters Patent is hereby corrected as shown below:

```
Column 1, line 51, delete "patent";
          line 61, after "terminal" add a period.
Column 3, line 60, change "end" to --ends--.
Column 4, line 16, change "is an" to -- in a --;
          line 40, change "non-use"  to -- nonuse --.
Column 5, line 25, change "or (rectifier)" to -- (or rectifier) --.
Column 7, line 26, change "a" to -- at --.
Column 8, at the end of Table 1, add the following line -- STATUS: + = ON,
          - = OFF --.
```

Signed and Sealed this

Thirty-first Day of October, 1989

Attest:

DONALD J. QUIGG

Attesting Officer

Commissioner of Patents and Trademarks